United States Patent
Huang et al.

(10) Patent No.: US 12,019,959 B2
(45) Date of Patent: Jun. 25, 2024

(54) DISTRIBUTED TENSOR NETWORK CONTRACTION SCHEME WITH SPLITTING BASED ON DYNAMIC ORDERING

(71) Applicant: ALIBABA GROUP HOLDING LIMITED, Grand Cayman (KY)

(72) Inventors: Jiachen Huang, San Mateo, CA (US); Fang Zhang, San Mateo, CA (US); Jianxin Chen, Kirkland, WA (US)

(73) Assignee: Alibaba Group Holding Limited, Grand Cayman (KY)

(*) Notice: Subject to any disclaimer, the term of this patent is extended or adjusted under 35 U.S.C. 154(b) by 790 days.

(21) Appl. No.: 17/139,281

(22) Filed: Dec. 31, 2020

(65) Prior Publication Data
US 2021/0209270 A1    Jul. 8, 2021

Related U.S. Application Data

(60) Provisional application No. 62/957,442, filed on Jan. 6, 2020.

(51) Int. Cl.
  *G06F 30/20* (2020.01)
  *G06F 17/16* (2006.01)
  *G06N 10/00* (2022.01)

(52) U.S. Cl.
  CPC ............... *G06F 30/20* (2020.01); *G06F 17/16* (2013.01); *G06N 10/00* (2019.01)

(58) Field of Classification Search
  CPC .......... G06F 30/20; G06F 17/16; G06F 30/33; G06N 10/00; G06N 10/80
  See application file for complete search history.

(56) References Cited

U.S. PATENT DOCUMENTS

2019/0286774 A1*  9/2019  Nannicini .............. G06T 11/206

OTHER PUBLICATIONS

Jeffrey M. Dudek, Leonardo Dueñas-Osorio, Moshe Y. Vardi: Efficient Contraction of Large Tensor Networks for Weighted Model Counting through Graph Decompositions. CoRR abs/1908.04381 (Year: 2019).*

PCT International Search Report and Written Opinion dated Mar. 31, 2021, issued in corresponding International Application No. PCT/US2020/067669 (17 pgs.).

European Patent Office Communication issued for Application No. 20912773.7 the Supplementary European Search Report (Art. 153(7) EPC) and the European search opinion dated May 8, 2023, 9 pages.

(Continued)

*Primary Examiner* — Steven W Crabb
(74) *Attorney, Agent, or Firm* — Finnegan, Henderson, Farabow, Garrett & Dunner, LLP

(57) ABSTRACT

Embodiments of the disclosure provide method for performing contraction on a tensor network. The method can include: receiving, by a system, a tensor network comprising a plurality of tensors and a plurality of edges among the plurality of tensors, wherein each edge is associated with a plurality of index elements; determining a contraction order of the tensor network; determining, among the plurality of edges, one or more edges for generating a plurality of sub-networks based on the tensor network; and distributing the plurality of sub-networks to a plurality of computing nodes of the system to perform, by the plurality of computing nodes, contraction on the plurality of sub-networks based on the contraction order.

17 Claims, 10 Drawing Sheets

(56) References Cited

OTHER PUBLICATIONS

Dumitrescu et al., "Benchmarking treewidth as a practical component of tensor network simulations," PLoS One, 19 pages (2018).
Fried et al., "qTorch: The quantum tensor contraction handler," PLoS One, 20 pages (2018).
Kourtis et al., "Fast counting with tensor networks," https://arxiv.org/pdf/1805.00475v1.pdf, 9 pages (2018).
Murg et al., "Tree Tensor Network State with Variable Tensor Order: An Efficient Multireference Method for Strongly Correlated Systems," J. Chem. Theory Comput., 11: 1027-2036 (2015).
Pfeifer et al., "Faster identification of optimal contraction sequences for tensor networks," https://arxiv.org/pdf/1304.6112.pdf, 25 pages (2015).
Schroder et al., "Tensor network simulation of multi-environmental open quantum dynamics via machine learning and entanglement renormalization," nature communications, 11 pages, (2019).

\* cited by examiner

| | | |
|---|---|---|
| Vector | $V_j$ |  |
| Matrix | $M_{i,j}$ |  |
| 3-index tensor | $T_{i,j,k}$ |  |

T (i, j, k, l, m)

300

310

US 12,019,959 B2

DISTRIBUTED TENSOR NETWORK CONTRACTION SCHEME WITH SPLITTING BASED ON DYNAMIC ORDERING

CROSS-REFERENCE TO RELATED APPLICATIONS

The present disclosure claims priority to and the benefits of priority to U.S. Provisional Patent Application No. 62/957,442, filed on Jan. 6, 2020. The provisional application is incorporated herein by reference in its entirety.

BACKGROUND

Tensors are a mathematical concept that can encapsulate and generalize the ideas of multi-linear maps. A tensor network can be a countable collection of tensors connected by contractions. Tensor networks have a wide range of applications in modern science and engineering, including machine learning, many-body theories, gradient computations, quantum computing, etc. As the use of tensor networks continue to expand, the efficiency for making computations with tensor networks become a bottleneck for many applications. The efficiency issue with the tensor networks is further exacerbated by the complex nature of the tensor networks, which often require significant computation power and time to perform. To continue to expand the use of tensor networks, there is a strong need for reducing the time and computation resources needed for tensor networks computations.

SUMMARY

Embodiments of the disclosure provide a method for performing contraction on a tensor network. The method can include: receiving, by a system, a tensor network comprising a plurality of tensors and a plurality of edges among the plurality of tensors, wherein each edge is associated with a plurality of index elements; determining a contraction order of the tensor network; determining, among the plurality of edges, one or more edges for generating a plurality of sub-networks based on the tensor network; and distributing the plurality of sub-networks to a plurality of computing nodes of the system to perform, by the plurality of computing nodes, contraction on the plurality of sub-networks based on the contraction order.

Embodiments of the present disclosure further provide a non-transitory computer readable medium that stores a set of instructions that is executable by at least one processor of a system to cause the system to perform contraction on a tensor network, the method comprising: receiving, a tensor network comprising a plurality of tensors and a plurality of edges among the plurality of tensors, wherein each edge is associated with a plurality of index elements; determining a contraction order of the tensor network; determining, among the plurality of edges, one or more edges for generating a plurality of sub-networks based on the tensor network; and distributing the plurality of sub-networks to a plurality of computing nodes of the system to perform, by the plurality of computing nodes, contraction on the plurality of sub-networks based on the contraction order.

Embodiments of the present disclosure further provide a system, comprising: a plurality of computing nodes; one or more memories storing a set of instructions; and one or more processors configured to execute the set of instructions to cause the system to perform: receiving a tensor network comprising a plurality of tensors and a plurality of edges among the plurality of tensors, wherein each edge is associated with a plurality of index elements; determining a contraction order of the tensor network; determining, among the plurality of edges, one or more edges for generating a plurality of sub-networks based on the tensor network; and distributing the plurality of sub-networks to the plurality of computing nodes of the system to perform, by the plurality of computing nodes, contraction on the plurality of sub-networks based on the contraction order.

It is to be understood that both the foregoing general description and the following detailed description are exemplary and explanatory only and are not restrictive of the disclosed embodiments, as claimed.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

A tensor network can include a plurality of tensors. A tensor can represent a multi-dimensional array that may include complex numbers. A tensor network can also include a plurality of indices associated with the tensors. Each tensor may include some or all of the plurality of indices. The tensor network can be a very useful tool, since it provides a visual language, accompanied by sets of mathematical tools, that simplifies fiendishly difficult computations.

Figure 1:
FIG. 1 illustrates a schematic of example tensors, according to some embodiments of the present disclosure.
Figure 1:
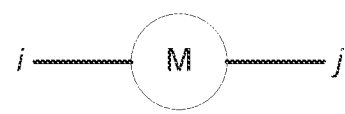
Figure 1:
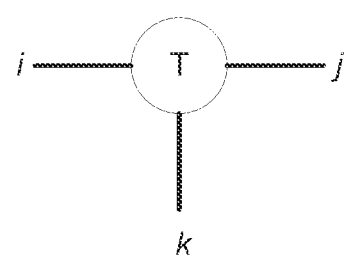

FIG. 1 illustrates a schematic of example tensors, according to some embodiments of the present disclosure. As shown in FIG. 1, tensors are notated by solid shapes, and tensor indices are notated by one or more lines emanating from the tensors. Tensor indices associated with a tensor can be denoted as subscript or superscript on the tensor. For example, FIG. 1 includes three different tensors—a vector tensor $V_j$, a matrix tensor $M_{i,j}$, and a 3-index tensor $T_{i,j,k}$. Vector tensor $V_j$ can be a 1-dimensional array of scalar values. Matrix tensor $M_{i,j}$ can be a 2-dimensional array of scalar values. The 3-index tensor $T_{i,j,k}$ can be a 3-dimensional array of scalar values. It is appreciated that tensors can have more than three indices.

Figure 2:
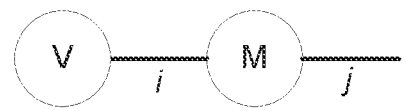
FIG. 2 illustrates a schematic of example tensor contractions, according to some embodiments of the present disclosure.

In a tensor network, tensors can be joined by tensor indices. Contraction of a tensor network can include merging indices of a same kind in different tensors, and sum over indices that do not appear in the final result. FIG. 2 illustrates a schematic of example tensor contractions, according to some embodiments of the present disclosure. As shown in FIG. 2, a tensor network contraction for tensors $V_i$ and $M_{i,j}$ can be denoted as $\Sigma_i V_i M_{i,j}$. After the contraction, the tensors $V_i$ and $M_{i,j}$ can be merged on index. It is appreciated that a tensor index can be connected to more than two tensors. These indices that can be connected to more than two tensors can be referred to as hyperedges. For this disclosure, we refer to edges and hyperedges interchangeably. For example, an edge can also be connected to more than two tensors.

A tensor index can be an open index or a closed index. An open index is an index that has an open end. For example, as shown in FIG. 2, index j is an open index, since it has an open end. A closed index is an index without an open end. For example, as shown in FIG. 2, index i is a closed index, since it does not have an open end.

In general, contracting a tensor network can involve contractions of open edges and closed edges. The contractions of open edges and closed edges can be intertwined. For example, contracting a tensor network can involve sequentially merging and summing up closed edges and merging open edges.

In some cases, contracting a tensor network can include two phases. In a first phase, closed indices can be merged and summed up one by one. In a second phase, the open indices are merged one by one. In many scenarios, the first phase can consume the majority of computational resources and time compared to the second phase. Moreover, although the order in which the closed indices are merged and summed up one by one does not change the final result, they affect significantly the time and resource consumption of the contraction process. The contraction order thus is to be chosen wisely in order to avoid unnecessary resource consumption.

Conventional designs of a tensor network have defects. For example, some tensor networks are based on matrix multiplication, which places burden on communication cost and memory space. Some tensor networks are designed based on the contraction of the tensor network in a fixed sequence. However, the fixed sequence may not be optimal.

To address the above problems, embodiments of the present disclosure provide methods and systems for performing contraction of a tensor network. For example, a way of contracting a tensor network is to defer the summation over some closed indices until at the end of the computation.

At the end of the computation, each term in the final summation corresponds to a sub tensor network which is simpler than the original tensor network. In scenarios where a distributed cluster is used, the contraction of a tensor network can be performed by distributing the plurality of sub tensor networks onto cluster nodes, and summing up the contraction results sent back from the cluster nodes.

Figure 3:
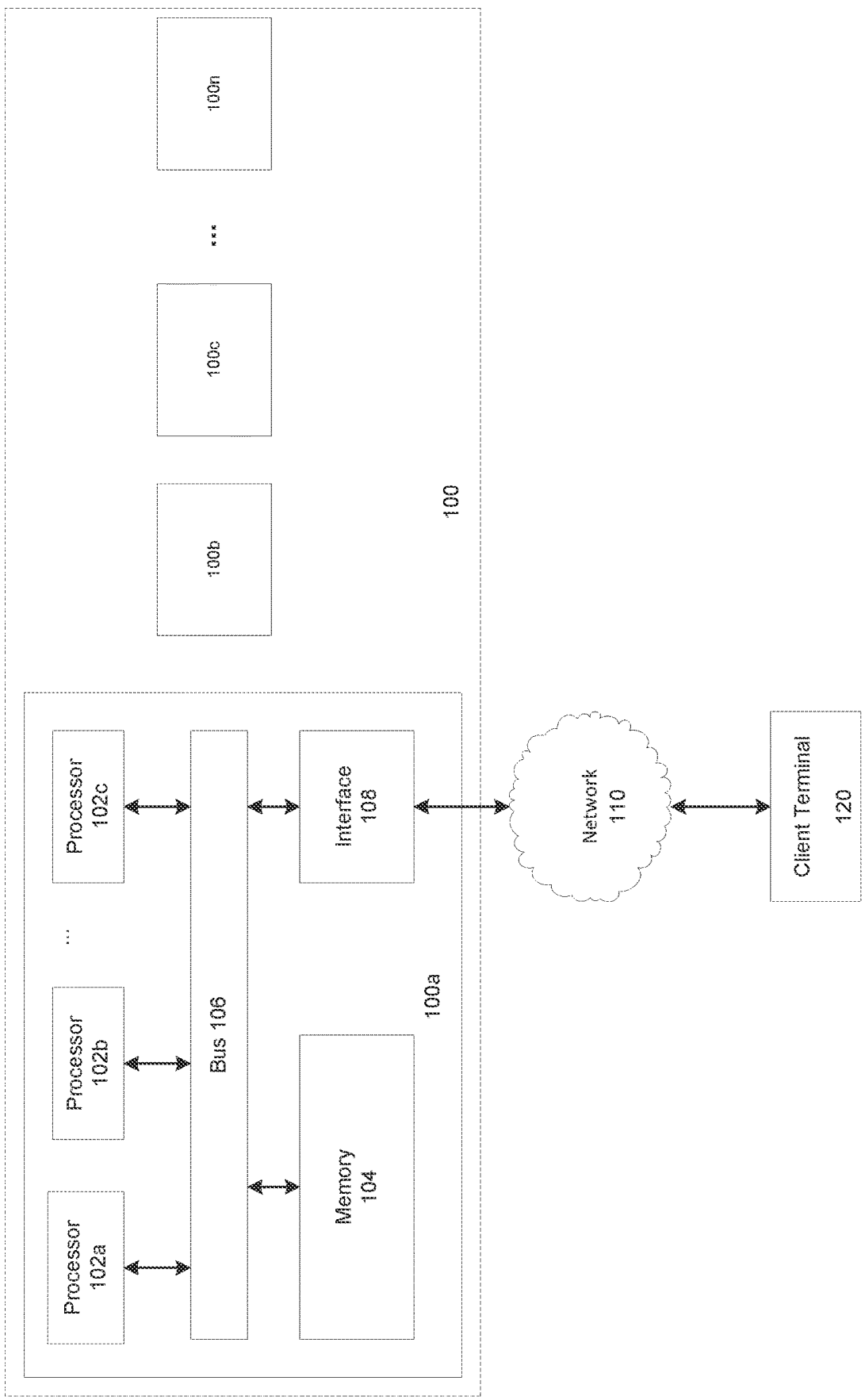
FIG. 3 illustrates a schematic of an exemplary cloud service system, according to some embodiments of the present disclosure.

FIG. 3 illustrates a schematic of an exemplary cloud service system 100, according to some embodiments of the present disclosure. Cloud service system 100 can include a plurality of computing devices to provide cloud service to users. As shown in FIG. 1, cloud service system 100 can include computing devices 100a, 100b, 100c, . . . , 100n. Each computing device (e.g., computing device 100a) can include at least one processor 102 (e.g., processor 102a, processor 102b, and processor 102c), a memory 104 communicatively coupled to at least one processor 102 via a bus 106, and an interface 108 communicatively coupled to bus 106.

At least one processor 102 can be any suitable processor capable of executing instructions. For example, processor 102a can be an X86 processor or an ARM processor. In some embodiments, at least one processor 102 can also include an accelerator (e.g., neural processing unit) for providing computing capability related to neural networks, such as neural network training and inference.

Memory 104 can be configured to store instructions and data accessible by at least one processor 102. For example, the instructions can be executed by at least one processor 102 to cause computing device 100a to execute a variety of functions. In some embodiments, memory 104 can be implemented by any suitable technology, such as a static random access memory ("SRAM"), a synchronous dynamic RAM ("SDRAM"), a nonvolatile memory, and the like.

Bus 106 can be configured to provide connection among components of computing device 100a. For example, at least one processor 102, memory 104, and network interface 106 can be connected with each other via bus 106.

Interface 108 can include a network interface providing wired or wireless network connection and an input/output ("I/O") interface communicatively coupled with peripheral devices (e.g., a cursor control device, a keyboard, a display, and the like). The network interface can be configured to provide communication between system 100 and a client terminal 120 via a network 110. Network 110 can be Internet, a private network, and the like. In some embodiments, client terminal 120 can be a personal computer, a server, a smart phone, a tablet, or any computing device. The I/O interface can include at least one of a Universal Serial Bus (USB) port, a peripheral component interconnect express (PCI-E) port, and the like for connection with the peripheral devices.

Figure 4:
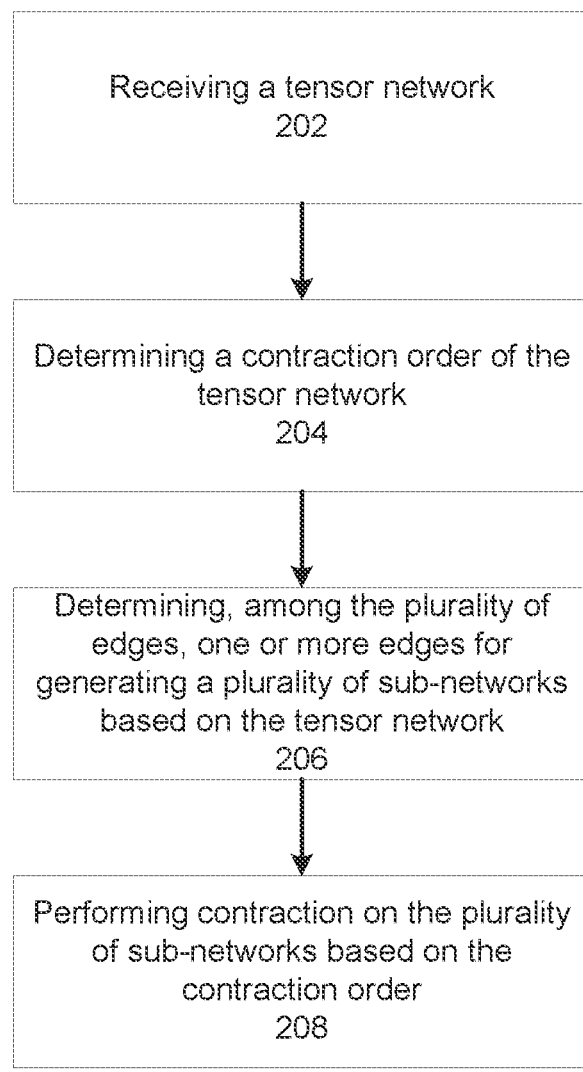
FIG. 4 illustrates a flowchart of an exemplary method for performing contraction of a tensor network, according to some embodiments of the present disclosure.

FIG. 4 illustrates a flowchart of an exemplary method 200 for performing contraction of a tensor network, according to some embodiments of the present disclosure. Method 200 can be implemented by a computing device (e.g., cloud service system 100 or computing device 100a of FIG. 3). Method 200 can include steps as follows.

In step 202, a tensor network is received. The tensor network can include a plurality of tensors. The tensor network can further include edges among the plurality of tensors. Edges, which can also be referred to as indices, are associated with the dimension of the tensor. The dimension of the tensor can also be referred to as a rank. For example, a tensor network $T_{i,j,k}$, including tensors $A_{i,j}$, $B_{j,k,l}$, and $C_{i,l}$, is a rank-three tensor network with edges i, j, k, and l. Tensor $B_{j,k,l}$ is a rank-three tensor, since it is associated with three edges. As $A_{i,j}$ and $B_{j,k,l}$ both have edge j, edge j is connected between $A_{i,j}$ and $B_{j,k,l}$. It can be seen that the edge l is merged in tensor network $T_{i,j,k}$, and thus it may be referred to a closed edge. It is appreciated that the edges of a tensor network can include zero or more closed edges and zero or more open edges.

Figure 5:
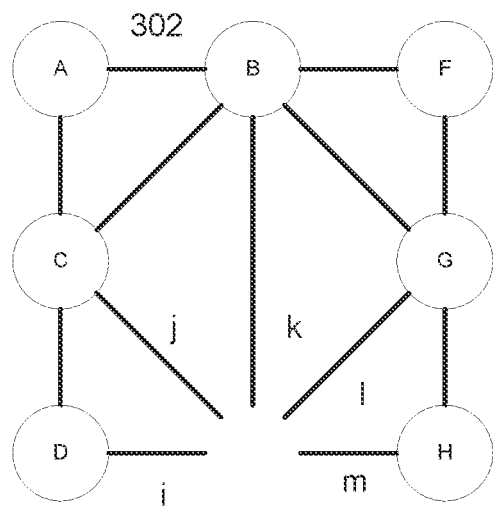
FIG. 5 illustrates an exemplary tensor network, according some embodiments of the present disclosure.

FIG. 5 illustrates an exemplary tensor network, according some embodiments of the present disclosure. As shown in FIG. 5, tensor network 300 can include tensors A, B, C, D, F, G, and H. Each of the tensors can include zero or more closed edges and zero or more open edges. For example, an edge 302 connecting between tensors A and B is a closed edge. An edge i with one end connected to tensor D and the other end left open is an open edge. Similarly, edges j, k, l, and m are also open edges. Therefore, tensor network 300 can also be described as a tensor network T(i, j, k, l, m), where edges i,j,k,l, and m are open edges in the tensor network.

Referring back to FIG. 4, in step 204, a contraction order of the tensor network is determined. For example, a contraction order can be determined according to a tree decomposition. As discussed above, the tensor network is associated with a plurality of edges for tensors, and each tensor may be associated with some or all of the plurality of edges. The contraction of the tensor network includes a process for merging edges of a same kind in different tensors. The contraction order is an order of merging edges.

To determine the contraction order, a virtual tensor can be created for connecting the one or more open edges. The virtual tensor is created to connect some or all open edges in the tensor network. The virtual tensor may include no data. The rank of the virtual tensor can be associated with the number of the open edges. For example, as shown in FIG. 5, tensor network 300 includes five open edges (i, j, k, l, m), and thus, a virtual tensor V for tensor network 300 can have a rank of five. In other words, the virtual tensor V has five edges corresponding to the open edges (i, j, k, l, m), and can be represented as, for example, V(i, j, k, l, m).

In some embodiments, a tree decomposition may be used to determine the contraction order of the tensor network. A tree decomposition is mapping of a graph into a tree that can be used to speed up solving computational tasks on the graph. A tensor network can be mapped as a tree according to tree decomposition. For example, each node in a tree can include one or more indices from the tensor network. Furthermore, the tree nodes that include a particular index may form a subtree. In some embodiments, every tensor in the tensor network may correspond to one or more nodes in the tree, such that the nodes include all the indices adjacent to the tensor.

In some embodiments, to perform the tree decomposition, a tree node can be chosen as the root node. The contraction order can be generated from the root tree in an iterative process, starting from an empty contraction order. In the iterative process, when there is a tree leaf node, the leaf node can be removed from the tree. For closed indices present in the leaf node but no longer present in the new tree, the closed indices can be appended to an end of the contraction order. The iterative process can be repeated until the tree is empty.

With the presence of the virtual tensor, a tree node can be selected to be the root node if it includes all the indices adjacent to the virtual tensor.

The contraction order can be generated from the root tree in an iterative process. The iterative process can start from an empty contraction order. While there is a tree leaf node, the leaf node can be removed from the tree. For all closed indices present in the leaf node but no longer present in the new tree, the closed indices can be appended to the end of the contraction order. The iterative process can be repeated until the tree is empty.

Figure 6:
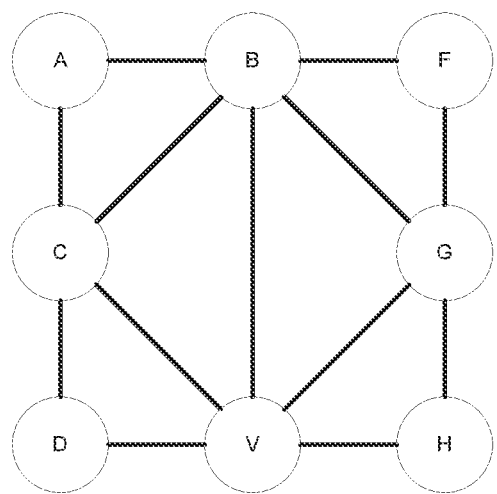
FIG. 6 illustrates an exemplary intermediate tensor network, according to some embodiments of the present disclosure.

Then, a computing device (e.g., cloud service system 100 or computing device 100a of FIG. 3) can generate an intermediate tensor network. FIG. 6 illustrates an exemplary intermediate tensor network, according to some embodiments of the present disclosure. It is appreciated that intermediate tensor network 310 shown in FIG. 6 can be an intermediate tensor network to tensor network 300 shown in FIG. 5. As shown in FIG. 6, open edges of a tensor network (e.g., tensor network 300 of FIG. 3A) can be closed by a virtual tensor V(i, j, k, l, m) that includes all the open edges. After the addition of virtual tensor (e.g., V(i, j, k, l, m)), the open edges in the tensor network (e.g., tensor network 300 of FIG. 3A) can become closed tensors.

Figure 7:
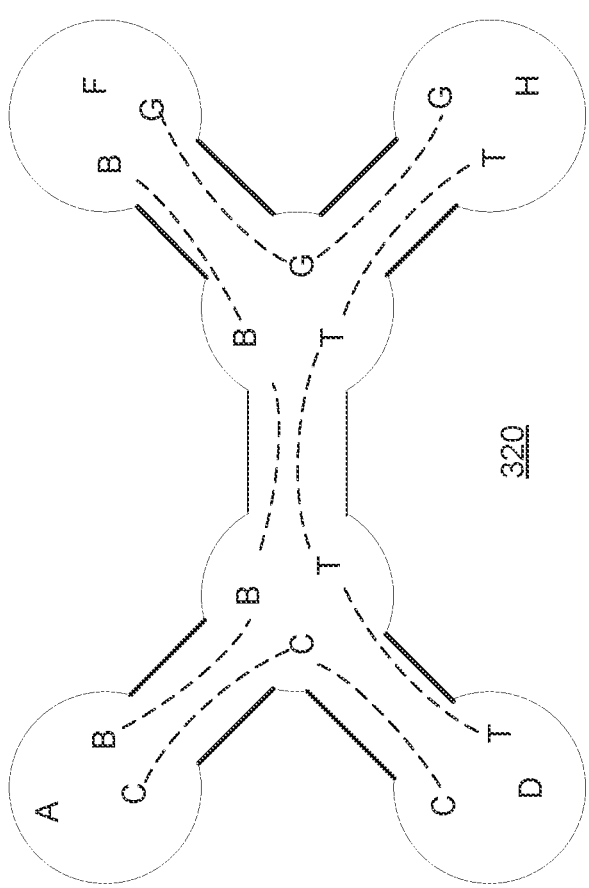
FIG. 7 illustrates a schematic of an exemplary tree diagram, according to some embodiments of the disclosure.

In some embodiments, the computing device can perform tree decomposition on the intermediate tensor network. Intuitively, a tree decomposition is a way of drawing a graph to look like a tree. To do so, sets of vertices, or bags, may be viewed as single vertices. The less a graph looks like a tree, the larger the bags become. In some embodiments, the tree decomposition can be performed using tree decomposition algorithms or computing programs (e.g., a subroutine). The contraction order of the tensor network can also be determined based on the tree. FIG. 7 illustrates a schematic of an exemplary tree diagram, according to some embodiments of the disclosure. As shown in FIG. 7, tree diagram 320 is generated by performing tree decomposition on intermediate tensor network 310 shown in FIG. 6. Tensors in intermediate tree 320 can be grouped into one or more tree nodes or bags. For example, as shown in FIG. 7, tensors A, B, and C can be grouped into a tree node. After the tree decomposition, intermediate tensor network 310 can have a tree-like structure.

Referring back to FIG. 4, in step 206, the computing device can determine, among the plurality of edges, one or more edges for generating a plurality of sub-networks based on the tensor network. In some embodiments, each edge can include one or more elements. As an example, an edge i in T(i, j, k, l, m) shown in FIG. 5 can include elements of i[0], i[1], i[2], . . . , i[7] and can be selected for generating a plurality of sub-networks. Therefore, a first sub-network corresponding to i[0], a second sub-network corresponding to i[1], a third sub-network corresponding to i[2], . . . , an eighth sub-network corresponding to i[7] can be generated.

Figure 8:
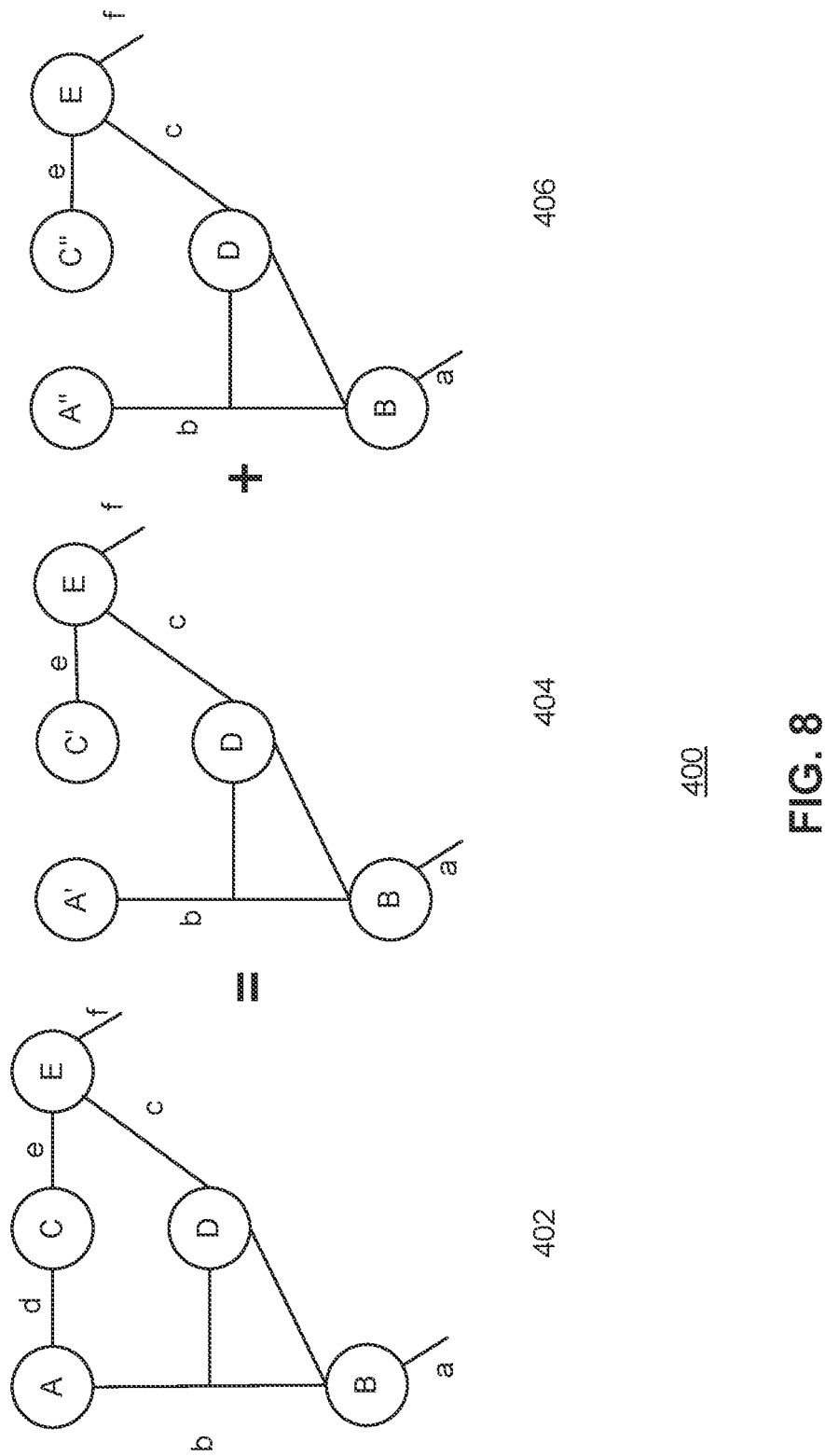
FIG. 8 illustrates an exemplary schematic of generating sub-networks, according to some embodiments of the disclosure.

In some embodiments, to determine the one or more edges for generating a plurality of sub-networks, the computing device can generate a plurality of evaluation sub-networks for each of the plurality of edges. FIG. 8 illustrates an exemplary schematic of generating sub-networks, according to some embodiments of the disclosure. As shown in FIG. 8, a tensor network 402 can include tensors (A, B, C, D, and E) and edges (a, b, c, d, e, and f). By splitting an edge (e.g., edge d), sub-networks 404 and 406 can be generated. In some embodiments, edge d can be in a range of {0, 1}. It is appreciated that the generation of sub-networks shown in FIG. 8 can be performed by a computing device (e.g., cloud service system 100 or computing device 100a of FIG. 3).

As shown in FIG. 8, by splitting the edge d, tensor network 402 can be replaced by the sum of two sub-networks 404 and 406. In some embodiments, sub-networks 404 and 406 have the same shape, but with possibly different tensors being associated to the corresponding nodes of the sub-networks. More particularly, sub-network 404 can be generated based on edge d being "0," and sub-network 406 is generated based on edge d being "1."

Accordingly, tensors $A'_b$ and $C'_e$ of sub-network 404 and tensors $A''_b$ and $C''_e$ of sub-network 406 can be represented as follows.

$$A'_b=A_{b0}, A''_b=A_{b1}$$

$$C'_e=C_{0e}, C''_e=C_{e1}$$

In some embodiments, for resource estimation purposes, only a sub-network's shape is needed. The shape of the sub-network is the same as the shape of the original tensor network (e.g., tensor network 402), except that an edge (e.g., edge d) is removed from the graph. For example, as shown in FIG. 8, the shape of sub-network 404 is the same as the shape of tensor network 402, except that edge d is removed from the graph.

In some embodiments, it is appreciated that the plurality of evaluation sub-networks do not have to be real sub-networks. Instead, the plurality of evaluation sub-networks can be virtual sub-networks for evaluation. As discussed above, the plurality of evaluation sub-networks can be generated by traversing the plurality of index elements of each edge and generating the plurality of evaluation sub-networks corresponding to the plurality of index elements. The computing device can then estimate resources consumption required for performing contraction on the tensor network based on the plurality of evaluation sub-networks, respectively. For example, in T(i, j, k, l, m) shown in FIG. 5, the resources consumption based on edges i, j, k, l, and m can be estimated. Among the estimated resources consumption, the computing device can determine the one or more edges that require lower resources consumption based on the estimation. For example, the computing device can determine the one or more edges that require the minimum resources consumption based on the estimation.

Figure 9:
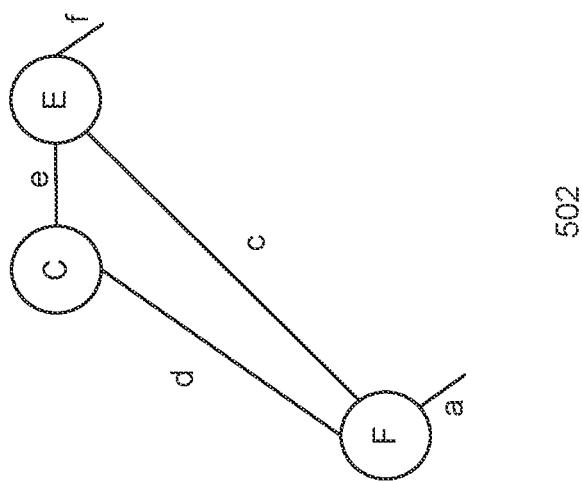
FIG. 9 illustrates a schematic of an exemplary contraction of a tensor network, according to some embodiments of the disclosure.
Figure 9:
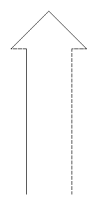
Figure 9:
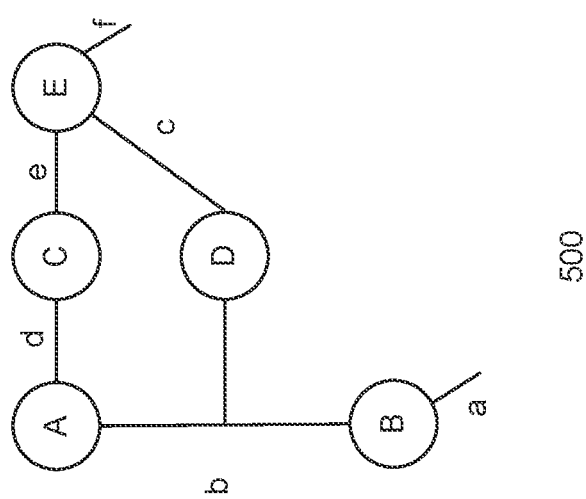

FIG. 9 illustrates a schematic of an exemplary contraction of a tensor network, according to some embodiments of the disclosure. It is appreciated that the contraction of tensor network 500 shown in FIG. 9 can be performed by a computing device (e.g., cloud service system 100 or computing device 100a of FIG. 3).

As shown in FIG. 9, tensor network 500 includes tensors (A, B, C, D, and E) and edges (a, b, c, d, e, and f). As an example, an edge b can be merged and summed over. As a result, a tensor network 502 is generated with a new tensor F replacing tensors connected by edge b (e.g., tensors A, B, and D). In some embodiments, tensor F can be represented by an equation below.

$$F_{acd}=\Sigma A_{bd}B_{ab}D_{bc}$$

To perform the contraction, the values of tensor F can be computed by the formula above. In generating tensor F, an additional space of dimension(a)×dimension(c)×dimension (d) is needed. Accordingly, computing tensor F can take dimension(a)×dimension(c)×dimension(d) amount of time. After computing tensor F, tensors A, B, D can be merged and removed from tensor network 500 to generate tensor network 502.

In some embodiments, merging tensors can involve matrix multiplication. In resource estimation, instead of performing the actual matrix multiplication right away, the cost of the matrix multiplication can be estimated first. The estimation of the cost of the matrix manipulation can depend on the shape of the intermediate tensors rather than the actual values. As a result, to estimate the resource consumption, the actual matrix computation may be omitted. In some embodiments, the resource consumption can include time consumption and space consumption. In some embodiments, the total time consumption is the sum of the time consumptions from each step. The space consumption may be the maximum value of the sum of the sizes of the tensors in the tensor network.

Referring back to FIG. 4, in step 208, contraction on the plurality of sub-networks can be performed based on the contraction order. In some embodiments, the computing device can perform the contraction on the plurality of sub-networks based on the contraction order. In some embodiments, the plurality of sub-networks can be distributed to a plurality of computing nodes (e.g., a plurality of cloud service devices 100 of FIG. 1) of a cloud system, respectively, for performing contraction on each of the plurality of sub-networks. As a result, contraction on some or all of the plurality of sub-networks can be performed in parallel.

In some embodiments, contraction of a tensor network can be performed in an iterative manner. In some embodiments, in each iterative step of the iterative manner, an edge at a front of the contraction order can be chosen and removed from the contraction order. All tensors adjacent to the chosen edge can be merged into a single new intermediate tensor. The new intermediate tensor can include all the edges that have been adjacent to one or more of the tensors that are adjacent to the chosen edge. The chosen edge and its neighbors in the tensor network can then be replaced by the new intermediate tensor. In some embodiments, the above iterative step can be repeated until the contraction order is empty.

In some embodiments, more than one tensor can be left in the tensor network. In this case, the more than one tensor can be merged to form a final tensor. In some embodiments, the final tensor is adjacent to all the open edges.

As discussed above, the resource consumption estimation can be performed by estimating the time and space consumption of the contraction process, respectively. In each step, an intermediate tensor can be generated and one or more tensors can be removed from the tensor network. The time consumption of the contraction may be estimated by the sum of the sizes of all the intermediate tensors. The space consumption may be estimated as a maximum value of the sum of the sizes of the tensors in the tensor network. Depending on the scenarios, the time and space consumptions can be merged into a single quantity which serves as a resource estimator for the contraction. For the same amount of computational resources consumed, the use of sub-networks can improve the computational time of contracting tensor networks by more than a 100 times.

In some embodiments, the plurality of sub-networks can be distributed to a plurality of computing nodes (e.g., a plurality of cloud service devices 100 of FIG. 1) of a cloud system, respectively, for performing contraction on each of the plurality of sub-networks. In some embodiments, during the contraction on each of the plurality of sub-networks, the computing node can further determine a final contraction order for each of the plurality of sub-networks, and then perform contraction on each of the plurality of sub-networks based on the final contraction order.

In some embodiments, the contraction processes shown above (e.g., method 200 of FIG. 4) can be used for quantum circuits or simulating quantum circuits. A quantum circuit is a computational routine in which a computation is a sequence of quantum gates. The quantum circuit can be an ordered sequence of quantum gates, measurements, and resets. A quantum gate can perform operations that change a qubit's state. A qubit is a basic variable in quantum computing, or a variant of the bit.

To simulate a quantum circuit, a quantum circuit C can be naturally regarded as a tensor network. The tensor network for the quantum circuit C can be represented as N(C). In some embodiments, each gate in the quantum circuit C can be regarded as a tensor in tensor network N(C). Qubit lines can be wires or closed edges that connect the tensors, or open edges that correspond to the input and output qubits. When contraction is performed on tensor network N(C), each edge can be contracted one by one and convolution of the corresponding tensors can be performed, until there is one vertex left. Having a degree of 0, this vertex can be labelled by a single number, which can provide a final measurement probability of the tensor network N(C) sought by the simulation. For tensor networks that include open edges, the final measurement after contraction can be a vector. One advantage of using tensor contraction to simulate quantum circuits is that the individual quantum gates in the circuit do not have to be necessarily simulated in their original order. In fact, a given gate may be simulated partially at several stages of the simulation.

Figure 10:
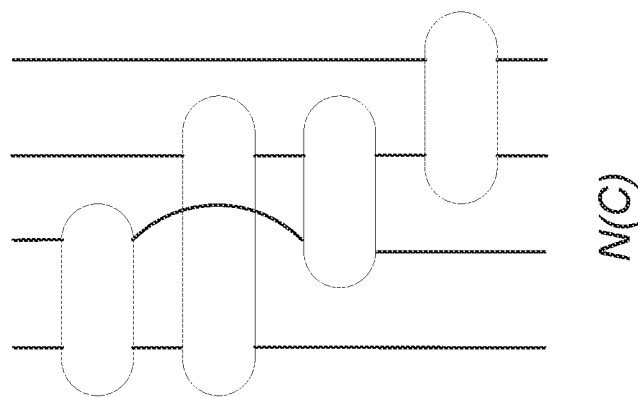
FIG. 10 illustrates a schematic of an exemplary representation of a quantum circuit using a tensor network, according to some embodiments of the disclosure.
Figure 10:
Figure 10:
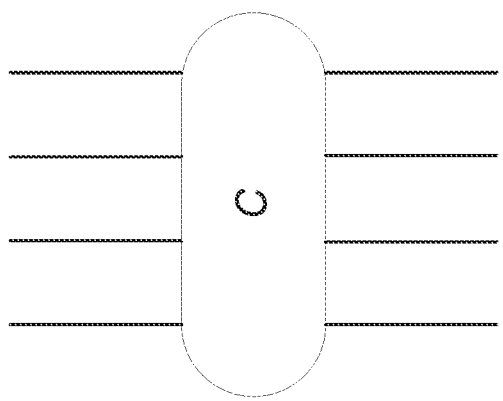

FIG. 10 illustrates a schematic of an exemplary representation of a quantum circuit using a tensor network, according to some embodiments of the disclosure. As shown in FIG. 10, a quantum circuit C is presented, with four input qubits (e.g., 4 qubit lines above quantum circuit C) and four output qubits (e.g., 4 qubit lines below quantum circuit C). Quantum circuit C can include one or more quantum gates.

As shown in FIG. 10, quantum circuit C can be represented as a tensor network N(C). In some embodiments, as shown in FIG. 10, tensor network N(C) includes 8 open edges. Four of the open edges (e.g., four edges above the tensors) can correspond to the inputs of quantum circuit C, and the other four of the open edges (e.g., four edges below the tensors) can correspond to the outputs of quantum circuit C. In some embodiments, the tensors shown in tensor network N(C) can correspond to the gates in quantum circuit C. In some embodiments, contracting tensor network N(C) gives tensor for the operator that quantum circuit C realizes.

Embodiments of the present disclosure provide methods and systems that use sub-networks to make estimations on computational costs on contraction orders. The methods and systems can be used for tensor networks with open edges, and the tensor networks discussed above can be used for simulating quantum circuits. By using sub-networks, The flow charts and diagrams in the figures illustrate the architecture, functionality, and operation of possible implementations of devices, methods, and computing program products according to various embodiments of the specification. In this regard, a block in the flow charts or diagrams may represent a software program, segment, or portion of code, which comprises one or more executable instructions for implementing specific functions. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the diagrams or flow charts, and combinations of blocks in the diagrams and flow charts, may be implemented by special purpose hardware-based systems that perform the specified functions or acts, or combinations of special purpose hardware and computer instructions.

As used herein, the terms "comprises," "comprising," or any other variation thereof are intended to cover a non-exclusive inclusion, such that a process, method, composition, article, or apparatus that comprises a list of elements does not include only those elements but may include other elements not expressly listed or inherent to such process, method, composition, article, or apparatus. The term "exemplary" is used in the sense of "example" rather than "ideal."

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is appreciated that the above described embodiments can be implemented by hardware, or software (program codes), or a combination of hardware and software. If implemented by software, it may be stored in the above-described computer-readable media. The software, when executed by the processor can perform the disclosed methods. The data storage system, secondary storage unit, other functional units described in this disclosure can be implemented by hardware, or software, or a combination of hardware and software. One of ordinary skill in the art will also understand that multiple ones of the above described functional units may be combined as one functional unit, and each of the above described functional units may be further divided into a plurality of functional sub-units.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

The embodiments may further be described using the following clauses:

1. A method for performing contraction on a tensor network, comprising: receiving, by a system, a tensor network comprising a plurality of tensors and a plurality of edges among the plurality of tensors, wherein each edge is associated with a plurality of index elements;
determining a contraction order of the tensor network;
determining, among the plurality of edges, one or more edges for generating a plurality of sub-networks based on the tensor network; and
distributing the plurality of sub-networks to a plurality of computing nodes of the system to perform, by the plurality of computing nodes, contraction on the plurality of sub-networks based on the contraction order.

2. The method according to clause 1, wherein:
the edges comprise one or more open edges and one or more closed edges, and
determining the contraction order of the tensor network further comprises:
creating a virtual tensor for connecting the one or more open edges;
generating an intermediate tensor network, the intermediate tensor network having the one or more open edges closed by the virtual tensor;

performing tree decomposition on the intermediate tensor network to construct a tree; and
determining the contraction order of the tensor network based on the tree.

3. The method according to clause 1 or 2, wherein determining, among the plurality of edges, the one or more edges for generating the plurality of sub-networks based on the tensor network further comprises:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

4. The method according clause 3, wherein generating the plurality of evaluation sub-networks for each of the plurality of edges further comprising:
traversing the plurality of index elements of each edge; and
generating the plurality of evaluation sub-networks corresponding to the plurality of index elements, respectively.

5. The method according to any one of clauses 1-4, further comprising:
performing, by the plurality of computing nodes, contraction on the plurality of sub-networks in parallel.

6. The method according to any one of clauses 1-5, further comprising:
determining a final contraction order for each of the plurality of sub-networks; and
performing contraction on each of the plurality of sub-networks based on the final contraction order.

7. The method according to any one of clauses 1-6, wherein:
the tensor network is used for simulating a quantum circuit that includes one or more quantum gates and one or more qubit lines,
the plurality of tensors correspond to the one or more quantum gates, and
the plurality of edges correspond to the one or more qubit lines.

8. The method according to any one of clauses 1-7, wherein the system is a cloud system.

9. A non-transitory computer readable medium that stores a set of instructions that is executable by at least one processor of a system to cause the system to perform contraction on a tensor network, the method comprising:
receiving, a tensor network comprising a plurality of tensors and a plurality of edges among the plurality of tensors, wherein each edge is associated with a plurality of index elements;
determining a contraction order of the tensor network;
determining, among the plurality of edges, one or more edges for generating a plurality of sub-networks based on the tensor network; and
distributing the plurality of sub-networks to a plurality of computing nodes of the system to perform, by the plurality of computing nodes, contraction on the plurality of sub-networks based on the contraction order.

10. The non-transitory computer readable medium according to clause 9, wherein:
the edges comprise one or more open edges and one or more closed edges, and
the set of instructions is executable by the at least one processor of the system to cause the system to further perform:
creating a virtual tensor for connecting the one or more open edges;
generating an intermediate tensor network, the intermediate tensor network having the one or more open edges closed by the virtual tensor;
performing tree decomposition on the intermediate tensor network to construct a tree; and
determining the contraction order of the tensor network based on the tree.

11. The non-transitory computer readable medium according to clause 9 or 10, wherein the set of instructions is executable by the at least one processor of the system to cause the system to further perform:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

12. The non-transitory computer readable medium according to clause 11, wherein the set of instructions is executable by the at least one processor of the system to cause the system to further perform:
traversing the plurality of index elements of each edge; and
generating the plurality of evaluation sub-networks corresponding to the plurality of index elements, respectively.

13. The non-transitory computer readable medium according clause 11, wherein the set of instructions is executable by the at least one processor of the system to cause the system to further perform:
traversing the plurality of index elements of each edge; and
generating the plurality of evaluation sub-networks corresponding to the plurality of index elements, respectively.

14. The non-transitory computer readable medium according to any one of clauses 10-13, wherein the set of instructions is executable by the at least one processor of the system to cause the system to further perform:
performing, by the plurality of computing nodes, contraction on the plurality of sub-networks in parallel.

15. The non-transitory computer readable medium according to any one of clauses 10-14, wherein the set of instructions is executable by the at least one processor of the system to cause the system to further perform:
determining a final contraction order for each of the plurality of sub-networks; and
performing contraction on each of the plurality of sub-networks based on the final contraction order.

16. The non-transitory computer readable medium according to any one of clauses 10-15, wherein the set of instructions is executable by the at least one processor of the system to cause the system to further perform:
the tensor network is used for simulating a quantum circuit that includes one or more quantum gates and one or more qubit lines,
the plurality of tensors correspond to the one or more quantum gates, and
the plurality of edges correspond to the one or more qubit lines.

17. The non-transitory computer readable medium according to any one of clauses 10-16, wherein the system is a cloud system.

18. A system, comprising:
a plurality of computing nodes;
one or more memories storing a set of instructions; and
one or more processors configured to execute the set of instructions to cause the system to perform:
receiving a tensor network comprising a plurality of tensors and a plurality of edges among the plurality of tensors, wherein each edge is associated with a plurality of index elements;
determining a contraction order of the tensor network;
determining, among the plurality of edges, one or more edges for generating a plurality of sub-networks based on the tensor network; and
distributing the plurality of sub-networks to the plurality of computing nodes of the system to perform, by the plurality of computing nodes, contraction on the plurality of sub-networks based on the contraction order.

19. The system according to clause 18, wherein:
the edges comprise one or more open edges and one or more closed edges, and
the one or more processors are further configured to execute the set of instructions to cause the system to perform:
creating a virtual tensor for connecting the one or more open edges;
generating an intermediate tensor network, the intermediate tensor network having the one or more open edges closed by the virtual tensor;
performing tree decomposition on the intermediate tensor network to construct a tree; and
determining the contraction order of the tensor network based on the tree.

20. The system according to clause 18 or 19, wherein the one or more processors are further configured to execute the set of instructions to cause the system to perform:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

21. The system according clause 20, wherein the one or more processors are further configured to execute the set of instructions to cause the system to perform:
traversing the plurality of index elements of each edge; and
generating the plurality of evaluation sub-networks corresponding to the plurality of index elements, respectively.

22. The system according to any one of clauses 18-21, wherein the one or more processors are further configured to execute the set of instructions to cause the system to perform:
performing, by the plurality of computing nodes, contraction on the plurality of sub-networks in parallel.

23. The system according to any one of clauses 18-22, wherein the one or more processors are further configured to execute the set of instructions to cause the system to perform:
determining a final contraction order for each of the plurality of sub-networks; and
performing contraction on each of the plurality of sub-networks based on the final contraction order.

24. The system according to any one of clauses 18-23, wherein the one or more processors are further configured to execute the set of instructions to cause the system to perform:
the tensor network is used for simulating a quantum circuit that includes one or more quantum gates and one or more qubit lines,
the plurality of tensors correspond to the one or more quantum gates, and
the plurality of edges correspond to the one or more qubit lines.

25. The system according to any one of clauses 18-24, wherein the system is a cloud system.

It is appreciated that certain features of the specification, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the specification. Certain features described in the context of various embodiments are not to be considered essential features of those embodiments, unless the embodiment is inoperative without those elements.

What is claimed is:

1. A method for performing contraction on a tensor network, comprising:
receiving, by a system, a tensor network comprising a plurality of tensors and a plurality of edges among the plurality of tensors, wherein the edges comprise one or more open edges and one or more closed edges, and each edge is associated with a plurality of index elements;
determining a contraction order of the tensor network by:
creating a virtual tensor for connecting the one or more open edges;
generating an intermediate tensor network, the intermediate tensor network having the one or more open edges closed by the virtual tensor;
performing tree decomposition on the intermediate tensor network to construct a tree; and
determining the contraction order of the tensor network based on the tree;
determining, among the plurality of edges, one or more edges for generating a plurality of sub-networks based on the tensor network; and
distributing the plurality of sub-networks to a plurality of computing nodes of the system to perform, by the plurality of computing nodes, contraction on the plurality of sub-networks based on the contraction order.

2. The method according to claim 1, wherein determining, among the plurality of edges, the one or more edges for generating the plurality of sub-networks based on the tensor network further comprises:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

3. The method according claim 2, wherein generating the plurality of evaluation sub-networks for each of the plurality of edges further comprising:
traversing the plurality of index elements of each edge; and generating the plurality of evaluation sub-networks corresponding to the plurality of index elements, respectively.

4. The method according to claim 1, further comprising:
performing, by the plurality of computing nodes, contraction on the plurality of sub-networks in parallel.

5. The method according to claim 1, further comprising:
determining a final contraction order for each of the plurality of sub-networks; and
performing contraction on each of the plurality of sub-networks based on the final contraction order.

6. The method according to claim 1, wherein:
the tensor network is used for simulating a quantum circuit that includes one or more quantum gates and one or more qubit lines,
the plurality of tensors correspond to the one or more quantum gates, and
the plurality of edges correspond to the one or more qubit lines.

7. The method according to claim 1, wherein the system is a cloud system.

8. A non-transitory computer readable medium that stores a set of instructions that is executable by at least one processor of a system to cause the system to perform:
receiving, a tensor network comprising a plurality of tensors and a plurality of edges among the plurality of tensors, wherein the edges comprise one or more open edges and one or more closed edges, and each edge is associated with a plurality of index elements;
determining a contraction order of the tensor network by:
creating a virtual tensor for connecting the one or more open edges;
generating an intermediate tensor network, the intermediate tensor network having the one or more open edges closed by the virtual tensor;
performing tree decomposition on the intermediate tensor network to construct a tree; and
determining the contraction order of the tensor network based on the tree;
determining, among the plurality of edges, one or more edges for generating a plurality of sub-networks based on the tensor network; and
distributing the plurality of sub-networks to a plurality of computing nodes of the system to perform, by the plurality of computing nodes, contraction on the plurality of sub-networks based on the contraction order.

9. The non-transitory computer readable medium according to claim 8, wherein the set of instructions is executable by the at least one processor of the system to cause the system to further perform:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

10. The non-transitory computer readable medium according to claim 9, wherein the set of instructions is executable by the at least one processor of the system to cause the system to further perform:
traversing the plurality of index elements of each edge; and
generating the plurality of evaluation sub-networks corresponding to the plurality of index elements, respectively.

11. A system, comprising:
a plurality of computing nodes;
one or more memories storing a set of instructions; and
one or more processors configured to execute the set of instructions to cause the system to perform:
receiving a tensor network comprising a plurality of tensors and a plurality of edges among the plurality of tensors, wherein the edges comprise one or more open edges and one or more closed edges, and each edge is associated with a plurality of index elements;
determining a contraction order of the tensor network by:
creating a virtual tensor for connecting the one or more open edges;
generating an intermediate tensor network, the intermediate tensor network having the one or more open edges closed by the virtual tensor;
performing tree decomposition on the intermediate tensor network to construct a tree; and
determining the contraction order of the tensor network based on the tree;
determining, among the plurality of edges, one or more edges for generating a plurality of sub-networks based on the tensor network; and
distributing the plurality of sub-networks to the plurality of computing nodes of the system to perform, by the plurality of computing nodes, contraction on the plurality of sub-networks based on the contraction order.

12. The system according to claim 11, wherein the one or more processors are further configured to execute the set of instructions to cause the system to perform:
generating a plurality of evaluation sub-networks for each of the plurality of edges;
estimating resource consumption required for performing contraction on the tensor network based on the plurality of evaluation sub-networks, respectively; and
determining the one or more edges that require lower consumption based on the estimation.

13. The system according claim 12, wherein the one or more processors are further configured to execute the set of instructions to cause the system to perform:
traversing the plurality of index elements of each edge; and
generating the plurality of evaluation sub-networks corresponding to the plurality of index elements, respectively.

14. The system according to claim 11, wherein the one or more processors are further configured to execute the set of instructions to cause the system to perform:
performing, by the plurality of computing nodes, contraction on the plurality of sub-networks in parallel.

15. The system according to claim 11, wherein the one or more processors are further configured to execute the set of instructions to cause the system to perform:
determining a final contraction order for each of the plurality of sub-networks; and
performing contraction on each of the plurality of sub-networks based on the final contraction order.

16. The system according to claim 11, wherein the one or more processors are further configured to execute the set of instructions to cause the system to perform:
the tensor network is used for simulating a quantum circuit that includes one or more quantum gates and one or more qubit lines,
the plurality of tensors correspond to the one or more quantum gates, and the plurality of edges correspond to the one or more qubit lines.

17. The system according to claim 11, wherein the system is a cloud system.

* * * * *